(12) United States Patent
Lee

(10) Patent No.: US 11,527,619 B2
(45) Date of Patent: Dec. 13, 2022

(54) NITRIDE-BASED SEMICONDUCTOR LAYER SHARING BETWEEN TRANSISTORS

(71) Applicant: TEXAS INSTRUMENTS INCORPORATED, Dallas, TX (US)

(72) Inventor: Dong Seup Lee, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 72 days.

(21) Appl. No.: 17/115,562

(22) Filed: Dec. 8, 2020

(65) Prior Publication Data

US 2022/0181449 A1    Jun. 9, 2022

(51) Int. Cl.
*H01L 29/20* (2006.01)
*H01L 29/06* (2006.01)
*H01L 29/51* (2006.01)

(52) U.S. Cl.
CPC ...... *H01L 29/2003* (2013.01); *H01L 29/0688* (2013.01); *H01L 29/518* (2013.01)

(58) Field of Classification Search
CPC ............ H01L 29/2003; H01L 29/0688; H01L 29/518
See application file for complete search history.

(56) References Cited

U.S. PATENT DOCUMENTS

2019/0267482 A1* 8/2019 Udrea ................ H01L 21/8252

* cited by examiner

*Primary Examiner* — Syed I Gheyas
(74) *Attorney, Agent, or Firm* — Jacqueline J. Garner; Frank D. Cimino

(57) ABSTRACT

A semiconductor structure includes a first transistor including a gate structure, a drain, and a source. The gate structure of the first transistor includes a nitride-based semiconductor layer. The semiconductor structure further includes a second transistor including a gate structure, a drain, and a source. The gate structure of the second transistor also includes a nitride-based semiconductor layer. The nitride-based semiconductor layer of the first transistor's gate structure is continuous with the nitride-based semiconductor layer of the second transistor's gate structure.

20 Claims, 6 Drawing Sheets

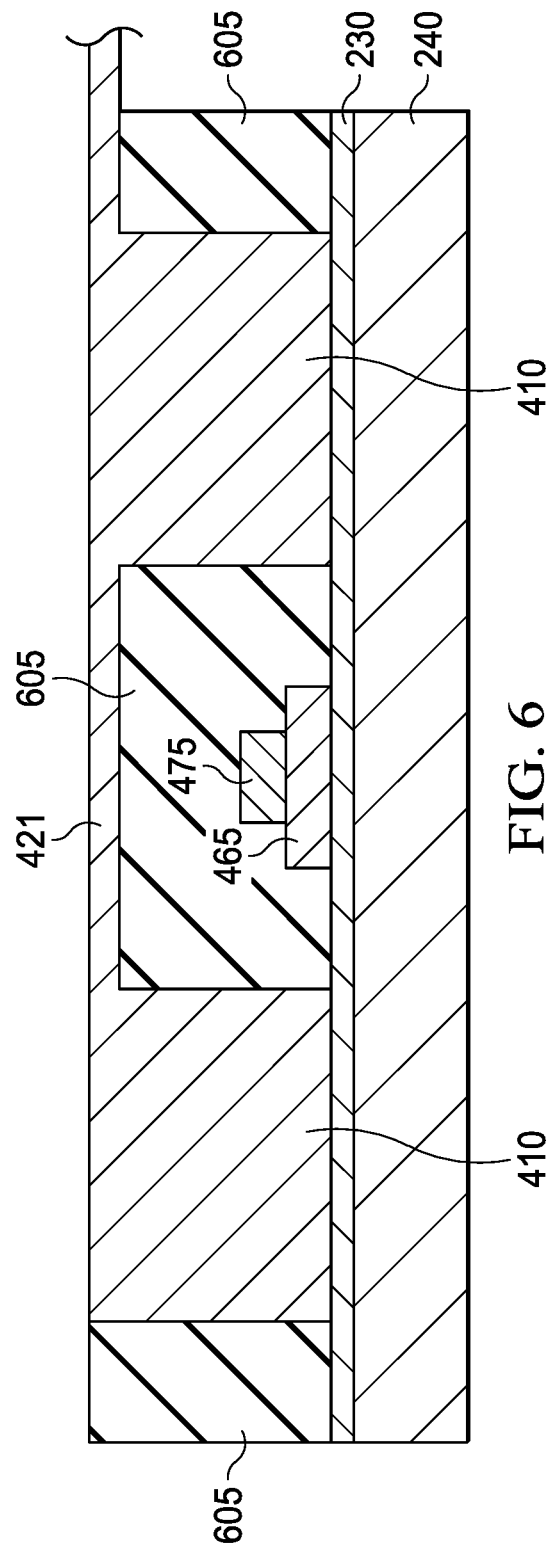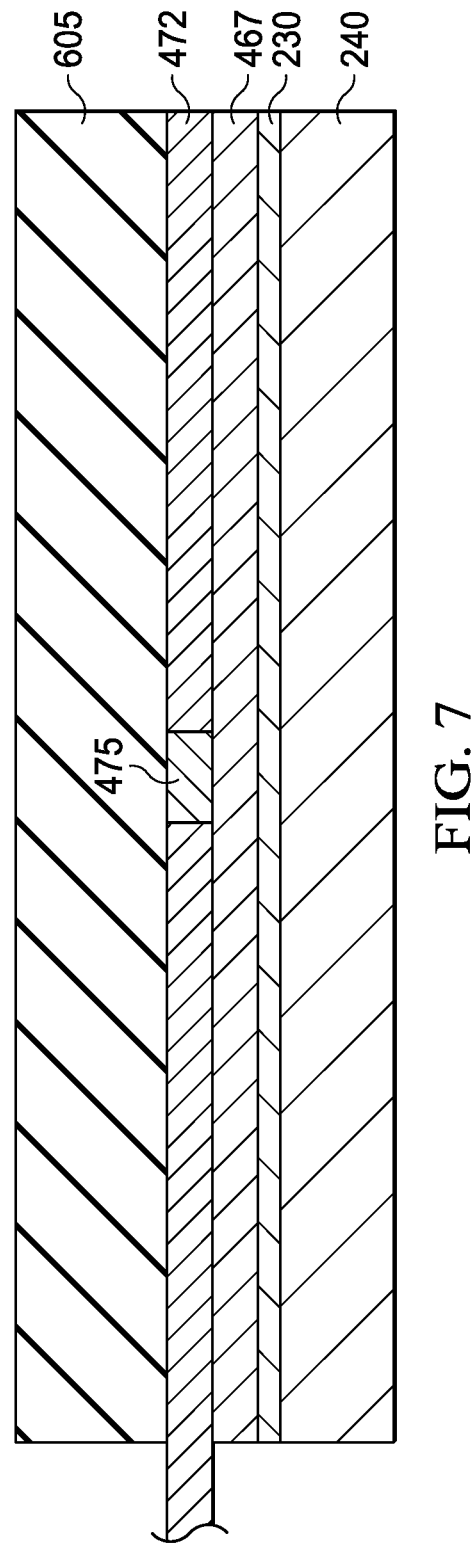

NITRIDE-BASED SEMICONDUCTOR LAYER SHARING BETWEEN TRANSISTORS

BACKGROUND

While silicon-based transistors are ubiquitous for numerous applications such as low voltage switches, gallium nitride-based transistors are also useful for various applications. Due to gallium nitride's relatively high carrier mobility and high breakdown voltage, gallium nitride transistors are well-suited for higher power applications such as power amplifiers and high voltage switches.

SUMMARY

In at least one example, a semiconductor structure includes a first transistor including a gate structure, a drain, and a source. The gate structure of the first transistor includes a nitride-based semiconductor layer. The semiconductor structure further includes a second transistor including a gate structure, a drain, and a source. The gate structure of the second transistor also includes a nitride-based semiconductor layer. The nitride-based semiconductor layer of the first transistor's gate structure is continuous with the nitride-based semiconductor layer of the second transistor's gate structure.

BRIEF DESCRIPTION OF THE DRAWINGS

For a detailed description of various examples, reference will now be made to the accompanying drawings in which:

FIG. 6 shows a cross-sectional view of the semiconductor structure of FIG. 4.

FIG. 7 shows another cross-sectional view of the semiconductor structure of FIG. 4.

DETAILED DESCRIPTION

To support the use of power amplifiers or high voltage switching transistors, gate driver circuits are used to control the on and off states of the transistors. When transistors such as gallium nitride transistors are used for the amplifiers or high voltage switches, integration efficiency and performance are increased if the gate driver and related analog circuits are also based on gallium nitride transistors. For example, if gate drivers were fabricated with silicon-based transistors, such transistors may be provided on a separate die from the gallium nitride power/switching transistors and the wire bond interconnects between the dies will unavoidably introduce parasitic capacitance and detrimentally impact the switching speed of the circuitry. However, by integrating gallium nitride-based gate driver and other analog circuits with gallium nitride power/switching transistors on a single die, the aforementioned wire bonds and their resulting parasitic capacitance and inductance are avoided.

Figure 1:
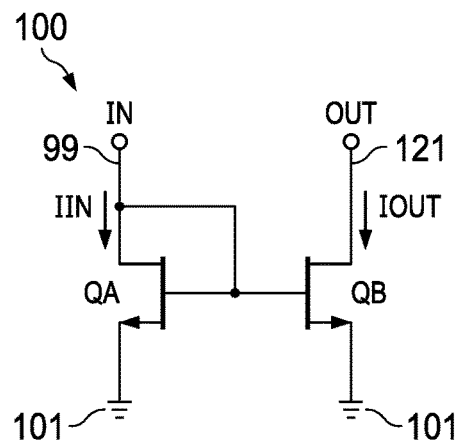
FIG. 1 shows an example of current mirror circuit including two transistors.

Lower power circuitry (e.g., gate drivers) used to support the on/off state of higher power gallium nitride transistors often include circuits in which current through one transistor should be a function of (e.g., equal to) current in another transistor. A current mirror is an example of such a circuit. FIG. 1 shows an example of a current mirror circuit 100 which includes transistor QA coupled to transistor QB. The gates of transistors QA and QB are coupled together and their sources are coupled to the ground terminal 101. The input (IN) 99 to the current mirror circuit 100 is the drain of transistor QA and the drain of QA is coupled to its gate as shown. The drain of transistor QB is the output (OUT) 121 of the current mirror circuit 100. Input current IIN flowing through transistor QA (i.e., from the drain of transistor QA to its source) is mirrored through transistor QB and is labeled as the output current IOUT.

Current IOUT is a function of IIN. The magnitude of the drain current through a transistor is a function of, among other parameters, the size of the transistor (size being the ratio of channel width (W) to channel length (L)), the gate-to-source voltage (Vgs), and the threshold voltage (Vt). The threshold voltage refers to the required gate voltage to make the channel potential reach a certain threshold. In one example, the size of transistors QA and QB match and thus, all else being equal (i.e., equal Vt, equal Vgs, etc.), the magnitude of IOUT equals the magnitude of IIN. In other examples, the size of transistor QB is different than the size of transistor QA, and thus the magnitude of IOUT is different than (but proportional to) the magnitude of IIN. For the example in which the transistors are of the same size, the current mirror ratio (IOUT/IN) should ideally be 1 (again, assuming equal Vt, etc.). For the example in which transistor QB is smaller than transistor QA, the current mirror ratio should be equal to the ratio of the sizes (size of QA/size of QB).

Figure 2:
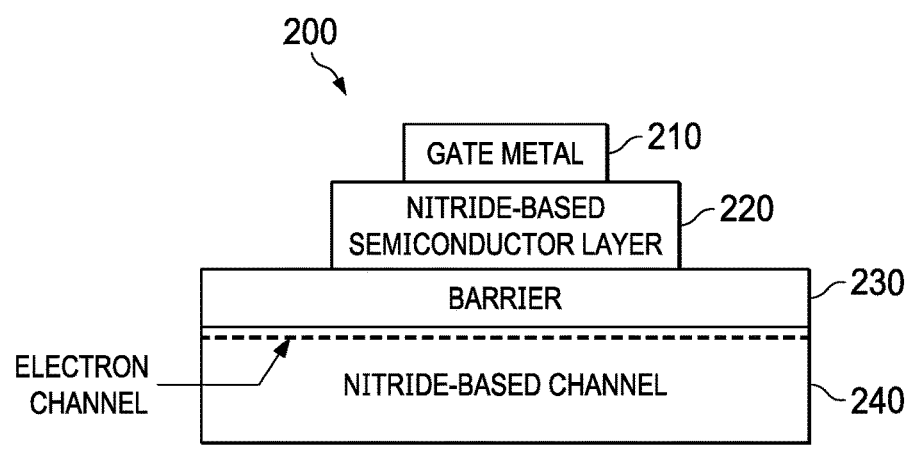
FIG. 2 shows an example of a gate structure of a nitride-based transistor.

For a current mirror comprising silicon-based transistors, matching the threshold voltage of QA and QB to a sufficient degree for a satisfactory performance of the current mirror (i.e. a current mirror ratio that is within a threshold range of a target value from one integrated circuit to another) is fairly straight forward. However, for gallium nitride-based transistors, matching the transistors for an adequately performing current mirror is problematic. FIG. 2 shows an example of the gate structure 200 for a nitride-based transistor. The gate structure 200 includes a gate metal 210, a nitride-based semiconductor layer 220, a barrier layer 230, and a nitride-based channel layer 240. The nitride-based semiconductor layer 220 is between the gate metal 210 and the barrier layer 230.

The nitride-based semiconductor layer 220 may be doped p-type and comprise gallium nitride, indium aluminum gallium nitride, aluminum gallium nitride, or aluminum nitride. The barrier layer 230 and the nitride-based channel layer 240 may be doped n-type and may comprise gallium nitride, indium aluminum gallium nitride, aluminum gallium nitride, or aluminum nitride. In one example, the nitride-based semiconductor layer 220 comprise gallium nitride (e.g., p-type gallium nitride), the barrier layer 230 comprise aluminum gallium nitride and the nitride-based channel layer 240 comprises n-type gallium nitride. Including the nitride-based semiconductor layer 220 causes the nitride-based transistor to be an enhancement mode transistor. Because enhancement mode transistors are off with no applied power (Vgs=0V), enhancement mode transistors are beneficial for safety and controllability reasons.

Figure 3:
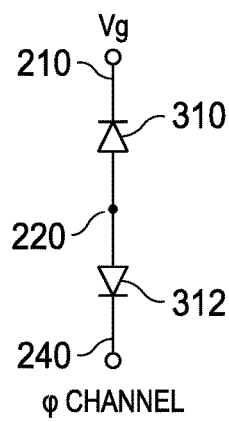
FIG. 3 shows an electrical model of the gate structure of the nitride-based transistor of FIG. 2.

FIG. 3 illustrates an electrical model of the gate structure 200 of FIG. 2. The nitride-based semiconductor layer 220 and gate metal 210 form a Schottky barrier 310. Further, the p-type nitride-based semiconductor layer 220 and the n-type barrier layer 230 form a p-n junction 312. From an electrical model standpoint, therefore, the gate structure 200 of FIG. 2 includes two series-connected diodes. A gate voltage Vg applied to the gate metal 210 causes a voltage to occur at the nitride-based semiconductor layer 220 that is approximately equal to a voltage of a Schottky barrier lower than Vg. The nitride-based semiconductor layer 220 is a floating layer in that its voltage floats up or down as a function of Vg.

To implement a current mirror circuit using enhancement mode nitride-based transistors, across process corners the threshold voltage (VT) of the nitride-based transistors forming a current mirror circuit should match. As explained above, the threshold voltage refers to the required gate voltage to make the channel potential reach a certain threshold. In p-type gallium nitride-based devices, there is a floating p-type gallium nitride layer between the gate metal and the channel. The floating p-type gallium nitride layer potential is controlled by the gate voltage and the p-type gallium nitride potential will determine the channel potential. Thus, by sharing the p-type gallium nitride layer, threshold voltage matching between the transistors of a current mirror can be improved. A lower standard deviation for the threshold voltages of two transistors within a current mirror would mean that there is less variation of the current mirror ratio across a sampling of current mirror circuits. To lower the standard deviation to produce higher quality current mirror circuits, in accordance with the examples described herein, the nitride-based semiconductor layer 220 is shared between the two enhancement mode nitride-based transistors.

Figure 4:
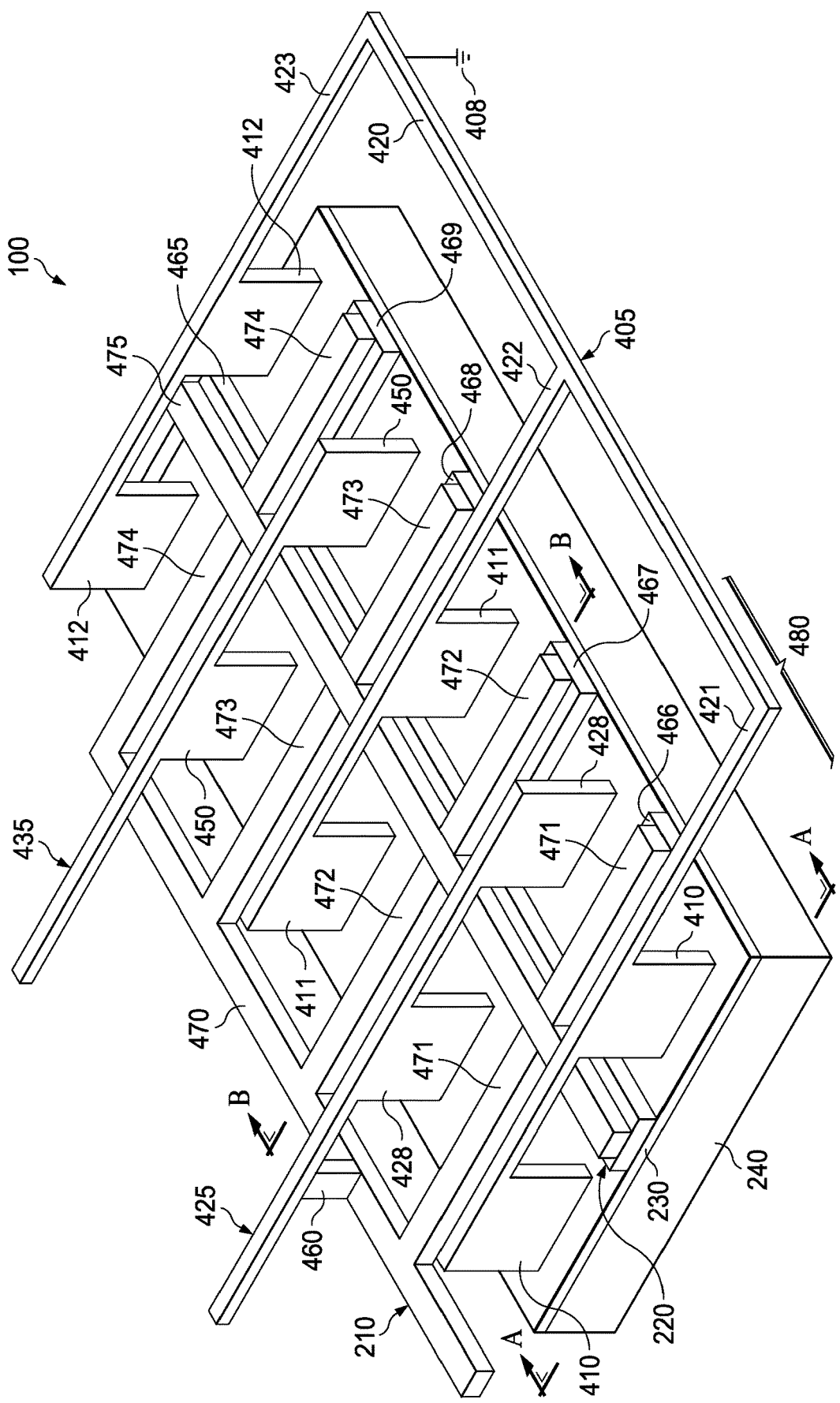
FIG. 4 shows a semiconductor structure comprising first and second gallium nitride transistors that share a nitride-based semiconductor layer between the gates of the respective transistors.
Figure 5:
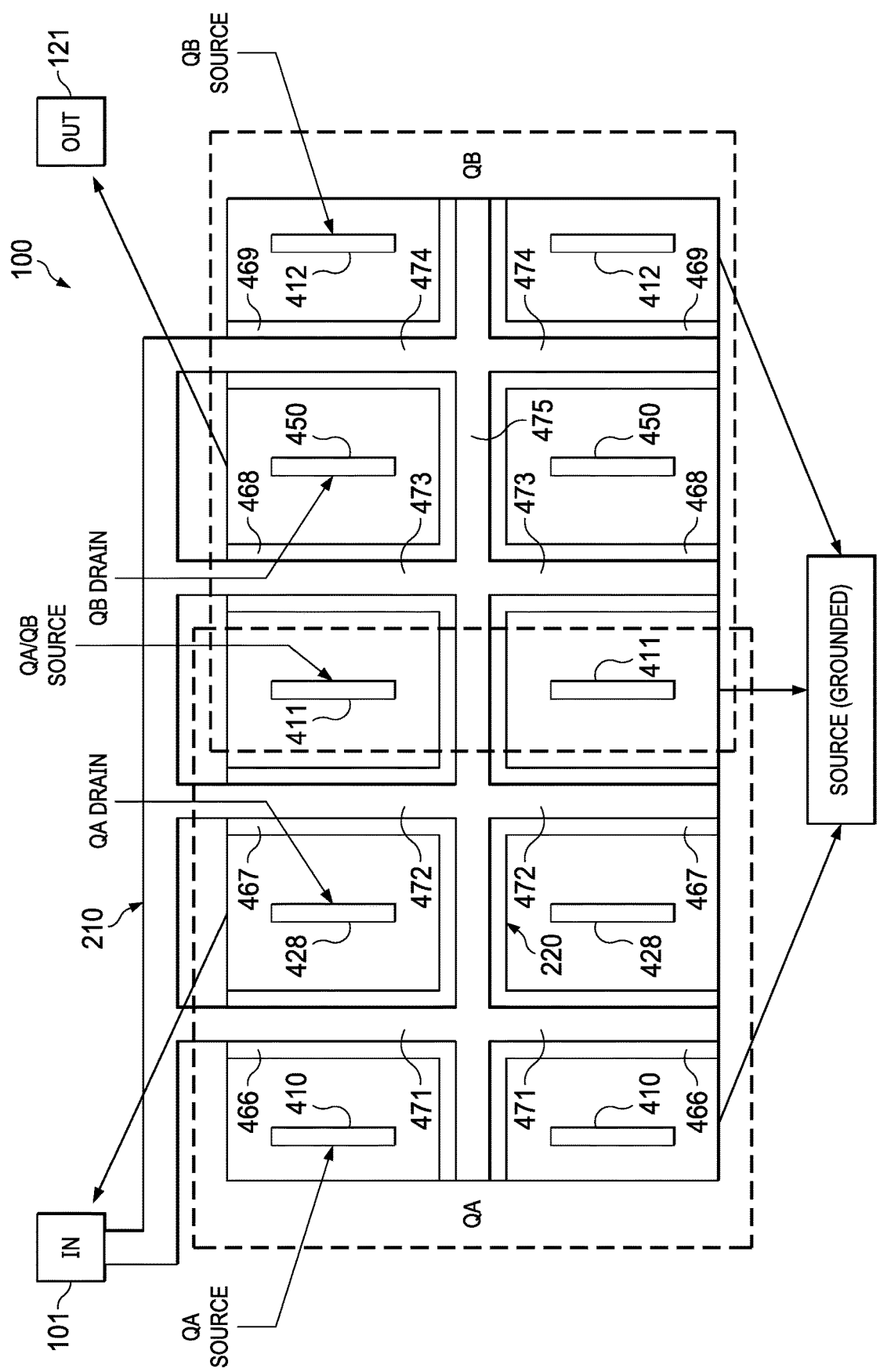
FIG. 5 shows a top down view of the semiconductor structure of FIG. 4.

FIGS. 4 and 5 show an example implementation of current mirror circuit 100 comprising two enhancement mode nitride-based transistors. FIG. 4 shows a three-dimensional perspective view of the current mirror circuit 100. FIG. 5 shows a two-dimensional top-down view of the current mirror circuit 100 and identifies transistors QA and QB. The structure shown in FIG. 4 includes a source 405 (which is shared between the two transistors) coupled to a ground terminal 408. The source 405 includes a spine 405 that extends longitudinally as shown. The source 405 also includes ribs 421, 422, and 423 which extend orthogonally from the spine 405 to vertical source portions 410, 411, and 422 that extend downward on to the barrier layer 230. FIG. 5 illustrates that vertical source portions 410 and 411 are part of transistor QA, while vertical source portions 411 and 412 are part of transistor QB. Vertical source portions 411 are common to both transistors QA and QB. For ease of viewability, FIG. 5 does not show the source spine 405 nor ribs 421-423.

Transistor QA includes drain 425 and corresponding vertical drain portions 428 extending downward to the barrier layer 230. Similarly, transistor QB includes drain 435 and corresponding vertical drain portions 450 extending downward to the barrier layer 230. Drain 425 of transistor QA is electrically connected to gate metal 100 via a metal connecting member 460.

The nitride-based semiconductor layer 220 includes a central spine 465 that extends parallel to spine 405 of the source and thus also extends longitudinally along the structure shown in FIG. 4. The nitride-based semiconductor layer 220 also includes ribs 466, 467, 468, and 469 extending orthogonally away from spine 465 on both sides of spine 465. Further, the gate metal layer 210 extends across the nitride-based semiconductor layer spine 465 and ribs 466-469. As such, the metal layer 210 includes a corresponding gate metal spine 475 on top of nitride-based semiconductor layer spine 465. Gate metal layer 210 also includes gate metal ribs 471, 472, 473, and 474 overlaying the nitride-based semiconductor layer ribs 466-469, respectively. In the example of FIGS. 4 and 5, each transistor QA and QB comprises two gate fingers. The gate fingers of transistor QA includes gate metal ribs 471 and 472 and the gate fingers of transistor QB includes gate metal ribs 472 and 474. In general, the transistors QA and QB may each have an even number of gate fingers.

As can be seen in FIGS. 4 and 5, the nitride-based semiconductor layer 220 is continuous between, and thus shared between, transistors QA and QB. As such, the voltage on the nitride-based semiconductor layer 220 with respect to both transistors is approximately the same. In nitride-based enhancement mode transistors, the nitride-based semiconductor layer is a floating layer between the gate metal and the channel. Because the nitride-based semiconductor layer potential directly affects the channel potential, sufficiently matching the nitride-based semiconductor layer potential between the two devices in current mirror circuits results in a better performing current mirror.

FIG. 4 shows two cross-sectional designations—A-A and B-B. Cross-section A-A is taken through laterally through the source region of the structure of FIG. 4 and cross-section B-B is taken laterally through the nitride-based semiconductor layer rib 467. FIG. 6 illustrates cross-sectional view A-A. Dielectric 605 (e.g., silicon nitride) is included to fill the void between the barrier layer 230 and the rib 421 of the source. FIG. 7 shows the cross-section B-B illustrating the nitride-based semiconductor layer 220 rib 467 between the gate metal rib 472 and the barrier layer 230. A cross-section of the nitride-based semiconductor layer's central spine 475 also is shown. Dielectric 605 is formed over the gate metal rib 472.

Figure 8:
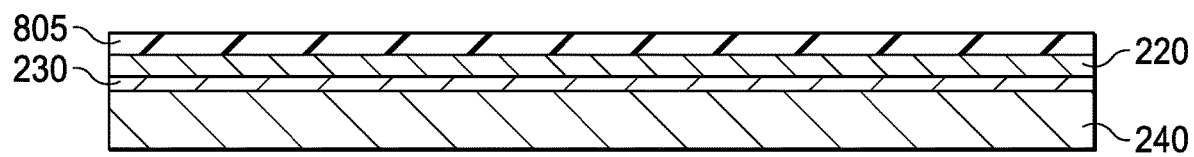
FIGS. 8-13 illustrate various process steps to form the semiconductor structure of FIG. 4.

FIGS. 8-13 illustrate various process steps to fabricate the structure shown in FIG. 4. The portion of the structure shown in FIGS. 8-13 is identified in FIG. 4 as portion 480 which represents one transistor finger. Portion 480 spans the cross-section of the structure from the vertical source portion 410 to the vertical drain portion 428. In FIG. 8, a stack of layers has been formed including nitride-based channel layer 240, barrier layer 230, nitride-based semiconductor layer 220, and a dielectric 805 (e.g., silicon nitride). The nitride-based channel layer 240 may be formed by an epitaxial growth processes using, for example, metal-organic chemic vapor deposition (MOCVD) or molecular beam epitaxy (MBE). The barrier layer 230 also may be epitaxially grown.

Figure 9:
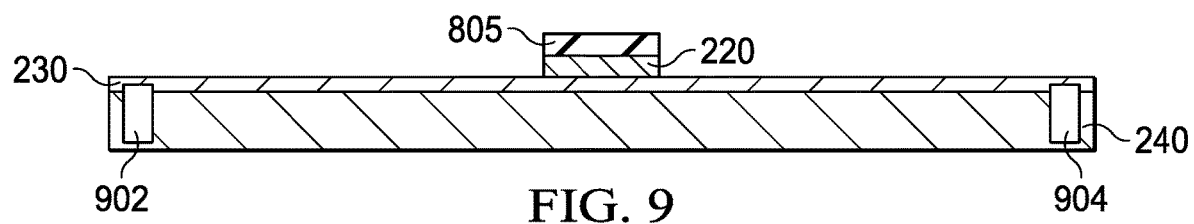

A mask is placed over dielectric 805 to thereby pattern a portion of the dielectric 805 and nitride-based semiconductor layer 220 as shown in FIG. 9. The relatively small portion of the nitride-based semiconductor layer 220 shown in FIG. 9 will form the nitride-based semiconductor layer 220 rib 471 (FIG. 4).

Figure 10:
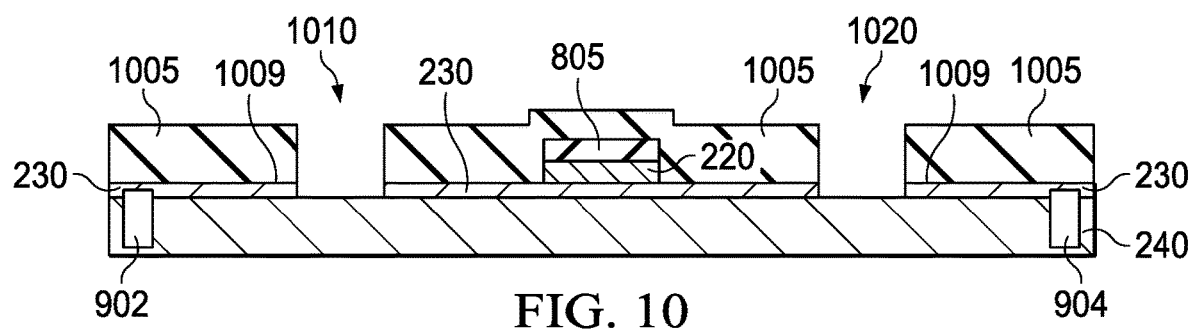

FIG. 10 illustrates that a dielectric 1005 (e.g., another layer of silicon nitride) is formed over barrier layer 230 and dielectric 805. A mask has been placed over dielectric 1005 and channels 1010 and 1020 etched through dielectric 1005 and the nitride-based semiconductor layer 220 to generally the top surface 1009 of the barrier layer 230. The vertical source portion 410 will be formed in channel 1010 and the vertical drain portion 428 will be formed in channel 1020. FIG. 10 also illustrates that isolation implants 902 and 904 are formed. In one example, arsenic or nitrogen is used as the dopant species is used as the implants 902 and 904. The heterostructure comprising the barrier layer 230 and the nitride-based channel layer 240 forms the channel at its interface and it is the main current path. The isolation implants render the heterostructure less conductive at the site of the isolation implants thereby effectively to electrically disconnecting the current mirror circuit 100 from other components on the die other than components intended to be connected to the current mirror circuit.

Figure 11:
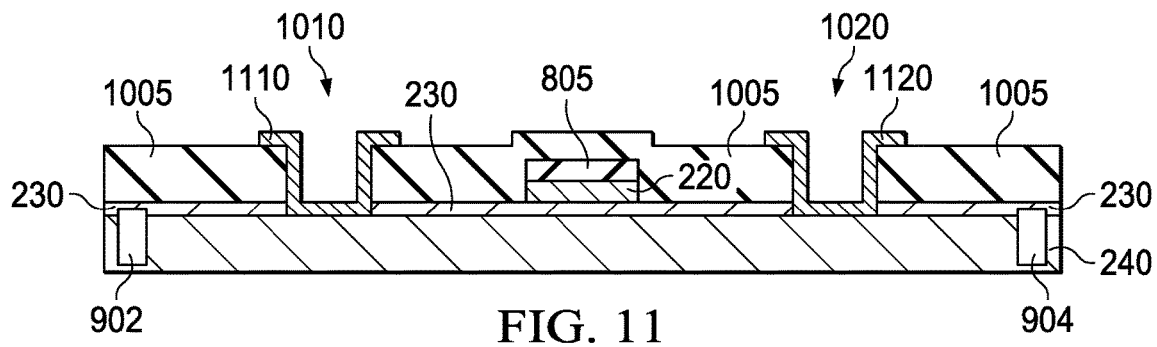
Figure 12:
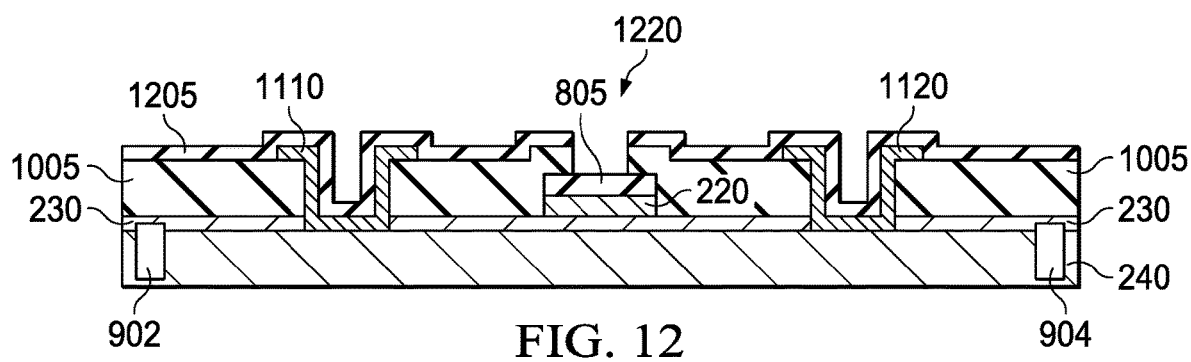
Figure 13:
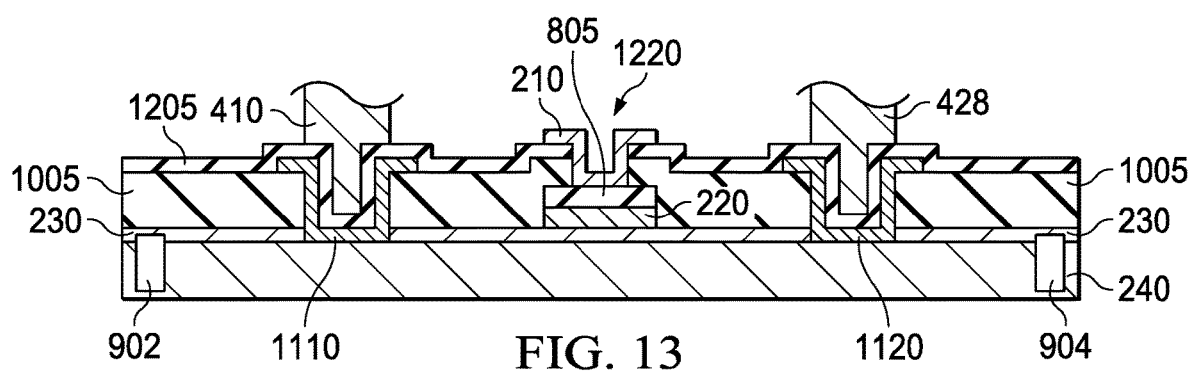

In FIG. 11, a metal 1110 and 1120 is deposited in channels 1110 and 1120, respectively, to form the ohmic contacts for the source and drain regions. In one example, metal 1110 and 1120 comprises a stack of titanium and aluminum. In FIG. 12, another dielectric layer 1205 (may be the same or different material as dielectric layer 1005) is formed over the structure. Using a mask, a channel 1220 is etched over the nitride-based semiconductor layer 220 as shown. FIG. 13 illustrates that the gate metal 210 is formed within the channel 1220 to form the gate metal rib 471 (FIG. 4), as well as the formation of the vertical source and drain portions 410 and 428, respectively. The cross-sectional shape of the gate metal 210 in FIG. 13 is C-shaped but can be other shapes as well (e.g., rectangular as is depicted in FIG. 4).

Modifications are possible in the described embodiments, and other embodiments are possible, within the scope of the claims.

What is claimed is:

1. A semiconductor structure, comprising:
    a first transistor comprising a gate structure, a drain, and a source, the gate structure of the first transistor including a nitride-based semiconductor layer; and
    a second transistor comprising a gate structure, a drain, and a source, the gate structure of the second transistor also including a nitride-based semiconductor layer, the nitride-based semiconductor layer of the first transistor's gate structure is continuous with the nitride-based semiconductor layer of the second transistor's gate structure.

2. The semiconductor structure of claim 1, wherein the nitride-based semiconductor layers of the gate structures of the first and second transistors comprises gallium nitride.

3. The semiconductor structure of claim 1, wherein the nitride-based semiconductor layers of the gate structures of the first and second transistors comprise indium aluminum gallium nitride.

4. The semiconductor structure of claim 1, wherein the nitride-based semiconductor layers of the gate structures of the first and second transistors comprise aluminum gallium nitride.

5. The semiconductor structure of claim 1, wherein the nitride-based semiconductor layers of the gate structures of the first and second transistors comprise aluminum nitride.

6. The semiconductor structure of claim 1, wherein the nitride-based semiconductor layers of the gate structures of the first and second transistors comprise at least one of p-type gallium nitride, p-type indium aluminum gallium nitride, p-type aluminum gallium nitride, or p-type indium gallium nitride.

7. The semiconductor structure of claim 1, further comprising a nitride-based channel layer and a barrier layer, the barrier layer being between the nitride-based semiconductor layer and the nitride-based channel layer, wherein the barrier layer comprises at least one of aluminum nitride, aluminum gallium nitride, indium nitride, and indium aluminum gallium nitride.

8. The semiconductor structure of claim 1, wherein the gate structures of the first and second transistors include a shared gate metal layer.

9. The semiconductor structure of claim 8, wherein the shared gate metal layer covers at least a portion of the nitride-based semiconductor layers of the gate structures of the first and second transistors.

10. The semiconductor structure of claim 1, wherein the first and second transistors are coupled together to form a current mirror circuit.

11. The semiconductor structure of claim 1, wherein the nitride-based semiconductor layer of the gate structure of the first transistor that is continuous with the nitride-based semiconductor layer of the gate structure of the second transistor comprises a first spine with first ribs extending orthogonally therefrom.

12. The semiconductor structure of claim 11, further comprising a metal layer comprising a metal spine and metal ribs, the metal spine over the first spine, and the metal ribs over the first ribs.

13. The semiconductor structure of claim 1, wherein the gate structure of the first transistor comprises an even number of gate fingers, and the gate structure of the second transistor comprises an even number of gate fingers.

14. A semiconductor structure comprising:
    a first gallium nitride transistor having a gate; and
    a second gallium nitride transistor having a gate;
    the gates of the first and second gallium nitride transistors share a common p-type gallium nitride layer.

15. The semiconductor structure of claim 14, wherein the gate structures of the first and second gallium nitride transistors include a shared gate metal layer.

16. The semiconductor structure of claim 15, wherein the shared gate metal layer covers at least a portion of the shared p-type gallium nitride layer.

17. The semiconductor structure of claim 14, wherein the first and second gallium nitride transistors are coupled together to form a current mirror circuit.

18. The semiconductor structure of claim 14, wherein the shared p-type gallium nitride layer comprises a first spine with first ribs extending orthogonally therefrom.

19. The semiconductor structure of claim 18, further comprising a metal layer comprising a metal spine and metal ribs, the metal spine over the first spine, and the metal ribs over the first ribs.

20. The semiconductor structure of claim 14, wherein the gate structure of the first gallium nitride transistor comprises an even number of gate fingers, and the gate structure of the second gallium nitride transistor comprises an even number of gate fingers.

* * * * *